(12) United States Patent
Kotani et al.

(10) Patent No.: US 8,508,118 B2
(45) Date of Patent: Aug. 13, 2013

(54) LIGHT EMITTING DEVICE THAT SUPPRESSES COLOR UNEVENNESS

(75) Inventors: Hiroshi Kotani, Tokyo (JP); Takaaki Sakai, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 0 days.

(21) Appl. No.: 13/427,849

(22) Filed: Mar. 22, 2012

(65) Prior Publication Data

US 2012/0242216 A1    Sep. 27, 2012

(30) Foreign Application Priority Data

Mar. 22, 2011   (JP) ................................ 2011-062983

(51) Int. Cl.
*H01J 1/62* (2006.01)
*H01J 63/04* (2006.01)

(52) U.S. Cl.
USPC ........... 313/501; 313/483; 313/500; 313/502; 313/503; 313/504; 313/505; 313/506

(58) Field of Classification Search
None
See application file for complete search history.

(56) References Cited

U.S. PATENT DOCUMENTS

2011/0133236 A1*   6/2011   Nozaki et al. ................... 257/98

FOREIGN PATENT DOCUMENTS

JP   2010-192629 A   9/2010

* cited by examiner

*Primary Examiner* — Natalie Walford
(74) *Attorney, Agent, or Firm* — Kenealy Vaidya LLP

(57) ABSTRACT

A light-emitting device that suppresses color unevenness can be provided. A transparent member can be disposed on a fluorescence-containing resin layer. Part of excitation light can be emitted upward from an edge surface of the fluorescence-containing resin layer directly and without passing through the transparent member. Thus, fluorescent light emitted in large quantities from a place near an edge surface of the transparent member can be mixed with the excitation light emitted from the edge surface of the fluorescence-containing resin layer directly without passing through the transparent member, thereby suppressing color unevenness at a location near the edge surface of the transparent member.

26 Claims, 9 Drawing Sheets

Fig. 6

Fig. 7A
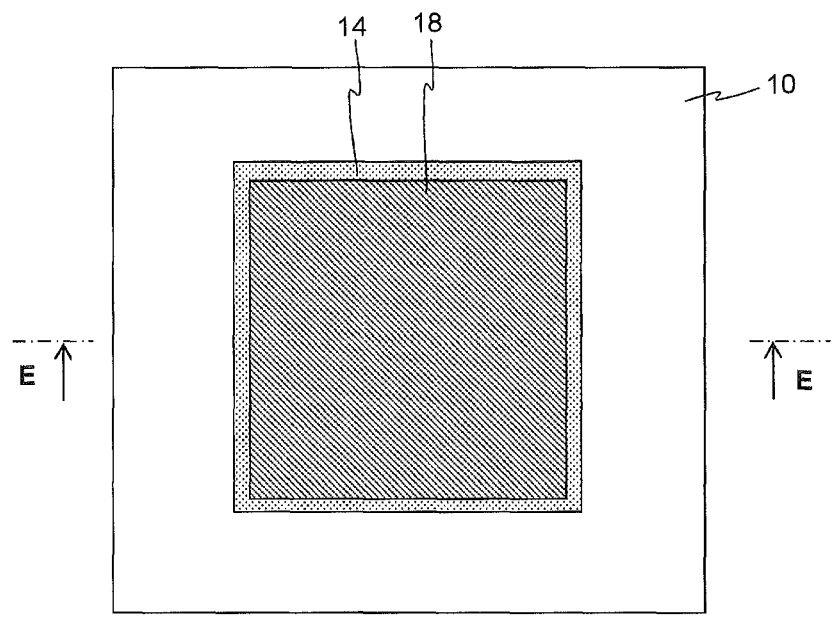
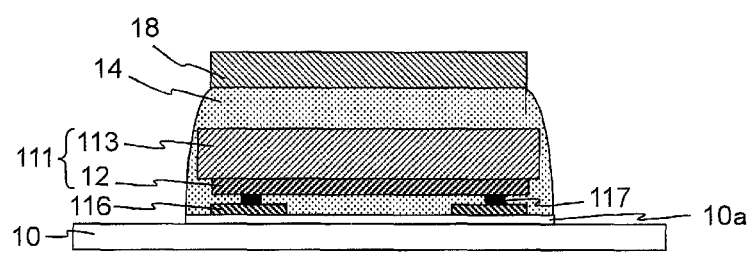
Fig. 7B

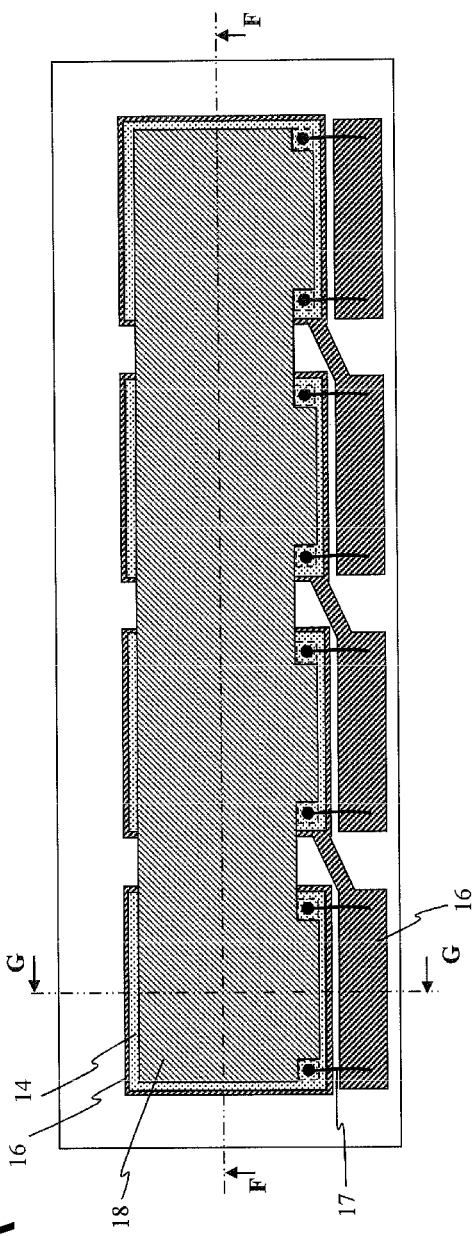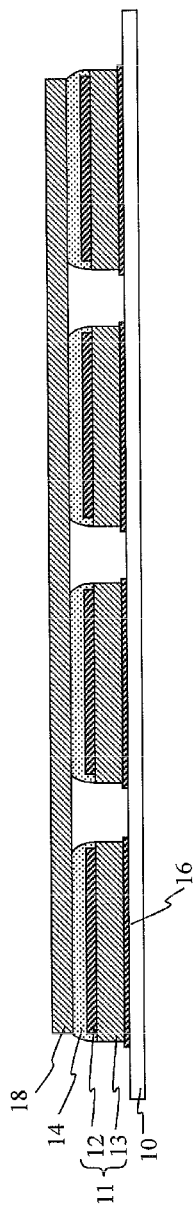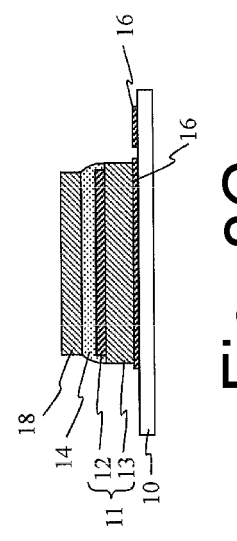
Fig. 8A
Fig. 8B
Fig. 8C

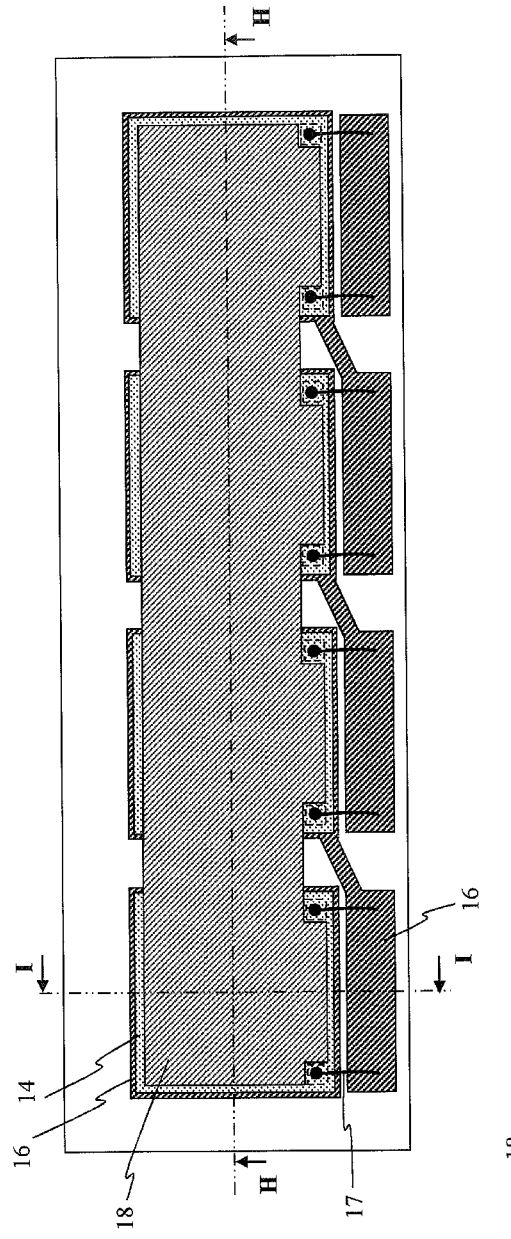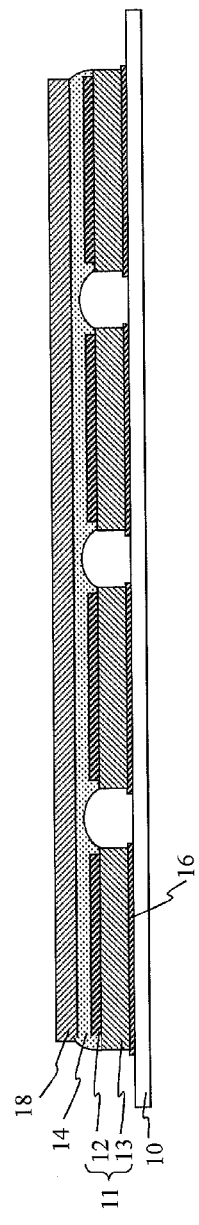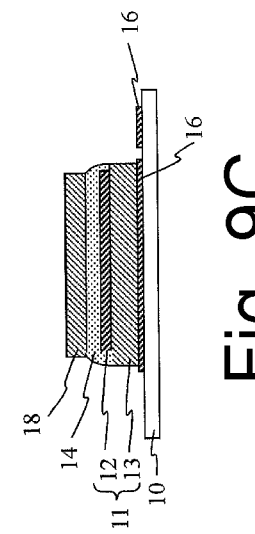
Fig. 9A
Fig. 9B
Fig. 9C

LIGHT EMITTING DEVICE THAT SUPPRESSES COLOR UNEVENNESS

This application claims the priority benefit under 35 U.S.C. §119 of Japanese Patent Application No. 2011-062983 filed on Mar. 22, 2011, which is hereby incorporated in its entirety by reference.

TECHNICAL FIELD

The presently disclosed subject matter relates to a light-emitting device that converts light from a light-emitting element with a wavelength conversion layer.

BACKGROUND ART

In a known light-emitting device, part of light from a light-emitting element is converted to light of a different wavelength by a fluorescent material, the converted light is mixed with the light from the light-emitting element, and resultant light is emitted from the light-emitting device. As an example, white light as a mixture of blue light and yellow light can be emitted by making the light-emitting element emit the blue light and making the fluorescent material convert part of the blue light to the yellow light.

Japanese Patent Application Laid-Open No. 2010-192629 (hereinafter called Patent Literature 1) discloses a structure where an adhesive layer is provided on the upper surface of a light-emitting element, and a plate-like light-transmitting member is disposed on the adhesive layer. The light-transmitting member contains a fluorescent material. Part of light emitted from the light-emitting element is converted to fluorescent light when the light passes through the light-transmitting member. Then, the fluorescent light and the light from the light-emitting element are mixed, and resultant light is emitted upward. In the structure of Patent Literature 1, a light-reflecting resin covers side surfaces of the light-emitting element and the light-transmitting member, so that light from the light-emitting element and the fluorescent light are reflected off the side surfaces. Thus, light is emitted only from the upper surface of the light-transmitting member, making it possible to obtain light of a high brightness level. Patent Literature 1 suggests formation of the light-reflecting resin at two stages so that the light-emitting element will not be covered with the adhesive layer.

In the structure of Patent Literature 1, the light-transmitting member is placed over the upper surface of the light-emitting element, and the light-reflecting member covers the light-emitting element and the light-transmitting member. In this structure, however, color unevenness is generated at an edge portion of the light-transmitting member. As an example, white light as a mixture of blue light and yellow light is emitted if light emitted from the light-emitting element is blue and fluorescent light is yellow. In this case, light becomes yellowish at the edge portion of the light-transmitting member, generating color unevenness.

The aforementioned color unevenness is generated due at least in part to the following reasons. As one reason, when blue light and yellow light are reflected off an edge surface of the light-transmitting member, the wavelength dependency of a refraction index causes the blue light and the yellow light to be reflected at different angles, generating a yellow color component and a blue color component separately. As a different reason, part of blue light caused to be reflected off the edge surface of the light-transmitting member by the light-reflecting resin is caused to be reflected again by the fluorescent material in the light-transmitting member to generate repeated reflection of the blue light between the edge surface and the fluorescent material. This makes the length of the optical path of the blue light longer before the blue light exits the light-transmitting member. Accordingly, the fluorescent material converts the wavelength of this blue light to yellow fluorescent light more easily than blue light at other parts.

SUMMARY

The presently disclosed subject matter was devised in view of these and other problems and features and in association with the conventional art. According to an aspect of the presently disclosed subject matter, a light-emitting device that suppresses color unevenness can be provided.

According to another aspect of the presently disclosed subject matter, a light-emitting device can include: a mounting substrate; a light-emitting element disposed on the mounting substrate; a fluorescence-containing resin layer disposed on the light-emitting element and containing fluorescent particles; and a light-transmitting plate-like member disposed on the fluorescence-containing resin layer. The light-emitting element can include a light emitting structure layer and a support substrate supporting the light emitting structure layer. The light emitting structure layer can include one or more than one semiconductor layer including at least a light emitting layer. The size of the plate-like member can substantially be the same as or smaller than the size of the light emitting structure layer. The fluorescence-containing resin layer can have a sloping edge surface connecting an edge portion of the plate-like member and an edge portion of the support substrate.

According to still another aspect of the presently disclosed subject matter, there is provided the following exemplary light-emitting device. The light-emitting device can include: a mounting substrate; a light-emitting element disposed on the mounting substrate; a fluorescence-containing resin layer disposed on the light-emitting element and containing fluorescent particles; and a light-transmitting plate-like member disposed on the fluorescence-containing resin layer. The light-emitting element can include a light emitting structure layer and a support substrate supporting the light emitting structure layer. The light emitting structure layer can include one or more than one semiconductor layer including at least a light emitting layer. The size of the plate-like member can substantially be the same as or smaller than the size of the light emitting structure layer. The fluorescence-containing resin layer can have an edge surface disposed on the outer side than a side surface of the plate-like member.

It is sometimes desirable that the thickness of the fluorescence-containing resin layer directly above an edge portion of the light emitting structure layer be greater than the particle diameter of the fluorescent particles contained in the fluorescence-containing resin layer. It is also sometimes desirable that the edge surface of the fluorescence-containing resin layer form an angle of 60 degrees or smaller relative to the normal to the support substrate. Additionally, at times it is desirable that a difference between the size of one side of the plate-like member and the size of a corresponding side of the light emitting structure layer be 50 μm or smaller.

If an electrode is formed on the upper surface of the light emitting structure layer, a sealing resin sealing a connection between the electrode and a bonding wire can be provided on the electrode.

A light-reflecting resin layer can be provided to face the edge surface of the fluorescence-containing resin layer and an edge surface of the plate-like member while a predetermined gap is left between the light-reflecting resin layer and the edge surfaces. This gap may be filled with a transparent material transparent to light emitted from the light-emitting element.

The presently disclosed subject matter includes an exemplary embodiment that allows part of light emitted from the edge surface of the fluorescence-containing resin layer to travel along the external side of the plate-like member. Accordingly, this light can be mixed with light generated as a result of wavelength separation at an edge portion of the plate-like member, thereby suppressing color unevenness.

BRIEF DESCRIPTION OF DRAWINGS

These and other characteristics, features, and advantages of the presently disclosed subject matter will become clear from the following description with reference to the accompanying drawings, wherein:

FIG. 6A explains the direction of travel of light in a light-emitting device of a third exemplary embodiment, and FIGS. 6B and 6C explain the direction of travel of light in light-emitting devices of Comparative Examples 2 and 3 respectively;

FIG. 7A is a top view, and FIG. 7B is a sectional view taken along line E-E of FIG. 7A showing a light-emitting device of a fourth exemplary embodiment;

FIG. 8A is a top view, and FIGS. 8B and 8C are sectional views taken along lines F-F and G-G of FIG. 8A, respectively, showing a light-emitting device of a fifth exemplary embodiment using a plurality of light-emitting elements;

FIG. 9A is a top view, and FIGS. 9B and 9C are sectional views taken along lines H-H and I-I of FIG. 9A, respectively, showing a different aspect of the light-emitting device of the fifth exemplary embodiment using a plurality of light-emitting elements.

DESCRIPTION OF EXEMPLARY EMBODIMENTS

A description will now be made below to exemplary light emitting devices of the presently disclosed subject matter with reference to the accompanying drawings in accordance with exemplary embodiments.

A light-emitting device of an exemplary embodiment of the presently disclosed subject matter is described below.

A plate-like transparent member can be provided on a fluorescence-containing resin layer. In this structure, part of an excitation light can be directly emitted upward from an edge surface of the fluorescence-containing resin layer without passing through the transparent member. Thus, fluorescent light emitted in large quantities from a place near an edge surface of the transparent member can be mixed with the excitation light emitted from the edge surface of the fluorescence-containing resin layer directly and without passing through the transparent member, thereby suppressing color unevenness at a location near the edge surface of the transparent member.

Figure 1A:
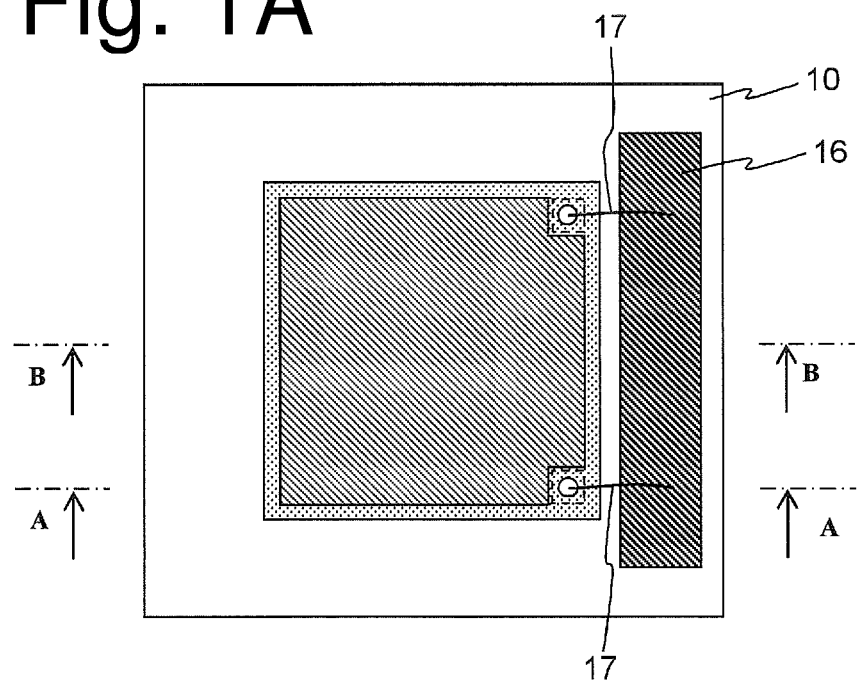
FIG. 1A is a top view.
Figure 1B:
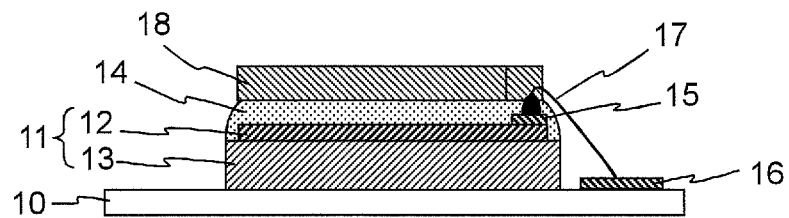
FIGS. 1B and 1C are sectional views taken along lines A-A and B-B of FIG. 1A, respectively, showing a light-emitting device of a first exemplary embodiment.
Figure 1C:
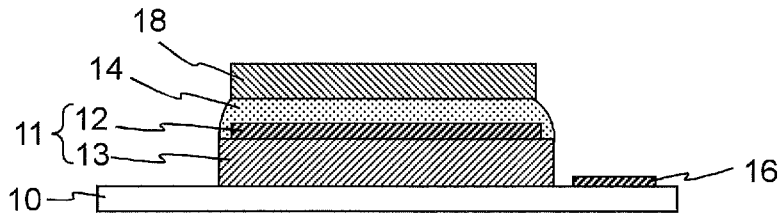

FIGS. 1A to 1C show a light-emitting device of a first exemplary embodiment. FIG. 1A is a top view, and FIGS. 1B and 1C are sectional views taken along lines A-A and B-B, respectively. To facilitate understanding of the drawings, hatchings are added to the top view of FIG. 1A.

An LED element 11 can be disposed on a mounting substrate 10 with an upper surface on which an electrode and an interconnect line are formed. The LED element 11 can include a light emitting structure (hereinafter called an epitaxial layer) 12 with a light emitting layer formed as a result of epitaxial growth of semiconductor, and a support substrate 13 supporting the epitaxial layer 12. The upper surface of the epitaxial layer 12 can be slightly smaller than the upper surface of the support substrate 13. An edge surface of the epitaxial layer 12 can be located inward of an edge surface of the support substrate 13 while a few tens of microns (<100 µm) such as 50 µm are left between the edge surfaces.

In addition to the light emitting layer, the epitaxial layer 12 may include a growth substrate used for epitaxial growth of the light emitting layer. The epitaxial layer 12 can be fixed by metal bonding to the support substrate 13.

The support substrate 13 can be opaque to the wavelength of light emitted from the epitaxial layer 12, and can be composed of a conductive material. An anode electrode (not shown) can be formed on the lower surface of the support substrate 13. Part of the mounting substrate 10 contacting the support substrate 13 can be given an electrode, and this electrode can be connected to the anode electrode of the support substrate 13 through a conductive die-attaching agent.

The upper surface of the epitaxial layer 12 can be rectangular. A pair of cathode electrodes 15 can be provided at two adjacent corner sections of the upper surface of the epitaxial layer 12. The pair of cathode electrodes 15 can be connected through bonding wires 17 to a bonding electrode pattern 16 on the mounting substrate 10.

A fluorescence-containing resin layer 14 can be provided on the upper surface of the LED element 11. The fluorescence-containing resin layer 14 can be made of a material containing a fluorescent material dispersed in a transparent resin. The fluorescent material can be excited by absorbing light (excitation light) generated by the LED element 11, and can generate fluorescent light of a predetermined wavelength. The transparent resin can be transparent to excitation light generated by the LED element 11 and fluorescent light. The fluorescence-containing resin layer 14 may be given transparent beads dispersed therein that function as a spacer to keep the thickness of the fluorescence-containing resin layer 14 constant.

The fluorescence-containing resin layer 14 can be provided over the entire upper surface of the support substrate 13 so as to cover the upper and edge surfaces of the epitaxial layer 12 of the LED element 11. An edge surface of the fluorescence-containing resin layer 14 can be a convex surface curved outward, or a sloping surface. The shape of the exemplary edge surface of the fluorescence-containing resin layer 14 is described in more detail later.

Figure 2:
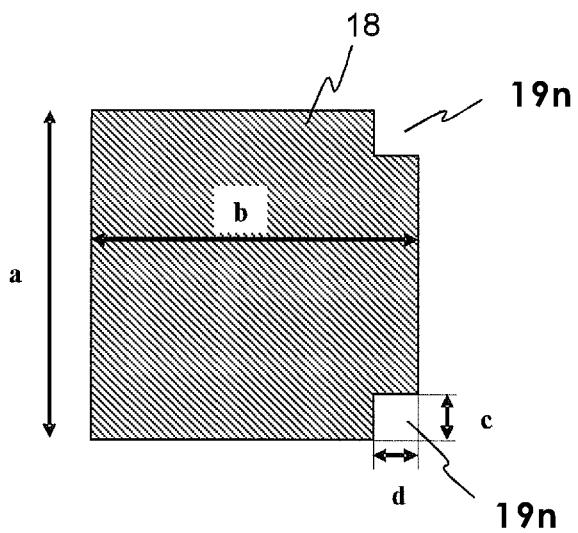
FIG. 2 is a top view of a transparent member of the light-emitting device shown in FIGS. 1A to 1C.

A plate-like transparent member 18 can be disposed on the fluorescence-containing resin layer 14. As shown in FIG. 2, the upper surface of the transparent member 18 can be rectangular corresponding to the rectangular shape of the upper surface of the epitaxial layer 12. Notches 19n can be formed at positions corresponding to the positions of the cathode electrodes 15.

Two sides of the rectangle of the transparent member 18 can have lengths a and b that are substantially the same as or shorter than the lengths A and B of corresponding two sides of the epitaxial layer 12 (a≦B, b≦B). If the lengths a and b of the two sides of the transparent member 18 are shorter than the lengths A and B of the two sides of the epitaxial layer 12, in certain applications it is desirable that differences between the corresponding sides do not exceed 50 µm. To be specific, the following relationships can be satisfied: (A−50 µm)≦a≦A and (B−50 µm)≦b≦B.

It is desirable in certain applications that the lengths c and d of two sides of each notch 19n be substantially the same as or longer than the lengths C and D of corresponding two sides of each cathode electrode 15 by a few tens of micrometers (such as 50 µm).

Figure 3:
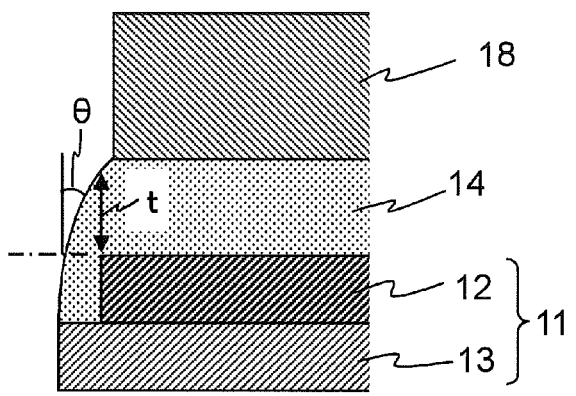
FIG. 3 is a sectional view showing in an enlarged manner an edge surface of a fluorescence-containing resin layer of the light-emitting device shown in FIGS. 1A to 1C.

As shown in FIG. 3, the edge surface of the fluorescence-containing resin layer 14 can have a sloping shape connecting an edge portion of the transparent member 18 and an edge portion of the support substrate 13. Accordingly, the thickness t of the fluorescence-containing resin layer 14 is substantially the same as or smaller than the thickness of the fluorescence-containing resin layer 14 directly below the transparent member 18. The thickness t can be the same as or greater than an average particle diameter of fluorescent particles. The average particle diameter of the fluorescent material of the instant application can be measured by a laser diffraction measuring system, and can be determined to be half the particle diameter on a volumetric basis obtained from a measuring result of a particle diameter distribution. This allows the fluorescent particles to be positioned at an upper part of the edge portion of the epitaxial layer 12. Thus, part of light emitted from a place near the edge portion of the upper surface of the epitaxial layer 12 can impinge on the fluorescent particles, and then can be converted to fluorescent light. Part of the edge surface of the fluorescence-containing resin layer 14 above the upper surface of the epitaxial layer 12 can have a steeply tapered shape that forms an angle θ of 60 degrees or smaller relative to the normal to the support substrate 13. The steeply tapered shape makes it possible to keep the great thickness of the fluorescence-containing resin layer 14 near the edge portion of the epitaxial layer 12.

Each layer is described in detail below in terms of its material and other characteristics. As the epitaxial layer 12, a layer including a publicly known light emitting layer made of GaN and the like and which generates blue light during operation can be used. The mounting substrate 10 can be made of a member achieving high heat dissipation effect and having high thermal conductivity. By way of example, a mounting substrate made of alumina or ceramic, a glass epoxy substrate with a through hole structure (formed of a member made of Cu or Ag), or the like may be used as the mounting substrate 10. The die-attaching agent used to place the LED element 11 on the mounting substrate 10 can be made of a material having a high melting point and high thermal conductivity such as AuSn.

The transparent resin as a base material of the fluorescence-containing resin layer 14 may be a silicon resin. Further, the fluorescent material may be a fluorescent material generating yellow light by using blue light as excitation light (such as a YAG fluorescent material). As an example, the fluorescence-containing resin layer 14 may be formed by dispersing the fluorescent material having an average particle diameter of about 12 µm in the transparent resin at 20 to 30% by weight. If transparent beads are mixed into the transparent resin to determine the thickness of the fluorescence-containing resin layer 14, the beads can have a particle diameter that provides a desired thickness. In this case, fluorescent particles can have a particle diameter smaller than that of the beads. As an example, the beads used can have a particle diameter of from about dia. 30 µm to about dia. 50 µm. The material of the beads can have a refraction index substantially the same as the refraction index n of the transparent resin (plus or minus 0.2 of n) functioning as the base material of the fluorescence-containing resin layer 14. As an example, beads made of a transparent material such as $SiO_2$ and alumina can be used. Or, the beads may be made of a transparent material containing a fluorescent material. In this case, fluorescent light can also be generated in the beads, so that fluorescent color will not be missed at the beads.

If beads are not mixed in the fluorescence-containing resin layer 14, the thickness of the fluorescence-containing resin layer 14 can be determined by the maximum particle diameter of fluorescent particles. Accordingly, fluorescent particles to be used can have a maximum particle diameter providing a desired thickness.

The transparent member 18 can be made of various materials including an inorganic material or resin. Meanwhile, it is desirable that the refraction index of the transparent member 18 be substantially the same as or lower than that of the fluorescence-containing resin layer 14. If the transparent member 18 is made of a material having a refraction index higher than that of the fluorescence-containing resin layer 14, reflection of light may be generated at an interface of the fluorescence-containing resin layer 14 and the beads dispersed in the fluorescence-containing resin layer 14 with the transparent member 18 to reduce light extraction efficiency. As an example, the material of the transparent member 18 may be a generally used glass material made of $SiO_2$, or sapphire. The transparent member 18 can be formed by following a polishing step, and a dicing step performed by using a dicing saw. In addition, the transparent member 18 may be formed by laser dicing, etching or the like.

Fluorescent particles can be dispersed in the transparent member 18. The transparent member 18 can also be made of fluorescent ceramic or fluorescent glass.

The operation of each part of the light-emitting device of the first exemplary embodiment is described below with reference to FIGS. 4A and 4B. Comparative Example 1 is described with reference to FIG. 4C.

Figure 4:
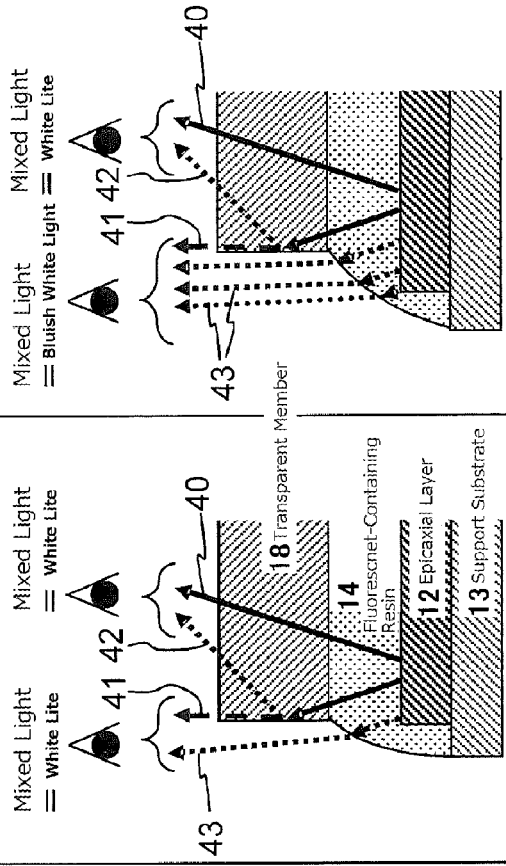
FIGS. 4A and 4B each explain the direction of travel of light in the light-emitting device of the first exemplary embodiment, and FIG. 4C explains the direction of travel of light in a light-emitting device of Comparative Example 1.

First, assume a case described below wherein the lengths a and b of the two sides of the transparent member 18 and the lengths A and B of the corresponding two sides of the epitaxial layer 12 have the relationships as follows as shown in FIG. 4A: (A−50 µm)≦a≦A and (B−50 µm)≦b≦B.

Application of a predetermined voltage from an electrode of the mounting substrate 10 to a back electrode of the support substrate 13 and the cathode electrodes 15 of the epitaxial layer 12 can generate blue light in the light emitting layer of the epitaxial layer 12. The blue light can enter the fluorescence-containing resin layer 14, and part of the blue light can be absorbed in the fluorescent material to be converted to yellow fluorescent light. The yellow fluorescent light can be mixed with part of the blue light left unconverted to become white light, and the white light can enter the bottom surface of the transparent member 18 through the upper surface of the fluorescence-containing resin layer 14. Much of the white light having entered the bottom surface of the transparent member 18 can pass through the transparent member 18 to reach the upper surface of the transparent member 18, and can be then emitted as white light 40 from the upper surface of the transparent member 18.

Part of the white light having entered the bottom surface of the transparent member 18 reaches an edge surface of the transparent member 18, can be reflected off the edge surface, and then can travel toward the upper surface of the transparent member 18. At this time, the wavelength dependency of the refraction index of the transparent member 18 can separate the white light into yellow light 41 having high spectrum intensity and blue light 42. The reflection angle of the yellow light 41 may be larger than that of the blue light 42. Accordingly, the yellow light 41 can be emitted in large quantities from a place near an edge portion of the upper surface of the transparent member 18. The yellow light 41 has chromaticity difference from the white light 40 around the yellow light 41, leading to color unevenness if nothing is done.

In the first exemplary embodiment, the size of the transparent member 18 can be designed to be substantially the same as or smaller than that of the epitaxial layer 12 as described above. This can dispose the sloping edge surface of the fluorescence-containing resin layer 14 at an outer side as compared to a location of the transparent member 18. The thickness of the fluorescence-containing resin layer 14 at the outer side (outside of the transparent member 18 when viewed from above) is smaller than the thickness of the fluorescence-containing resin layer 14 directly below the transparent member 18. Accordingly, the fluorescent material can be present in smaller amount in the fluorescence-containing resin layer 14 on the outer side than the fluorescent material located in the fluorescence-containing resin layer 14 in a region directly below the transparent member 18, making conversion efficiency lower in a region on the outer side than the transparent member 18 than in the region directly below the transparent member 18. As a result, bluish white light 43 containing many blue color components may be emitted from the edge surface of the fluorescence-containing resin layer 14 at the outer side (outside the transparent member 18).

In the first exemplary embodiment, the size of the transparent member 18 is designed to be substantially the same as or smaller than that of the epitaxial layer 12 as described above. Thus, the thickness of the fluorescence-containing resin layer 14 directly above an edge portion of the epitaxial layer 12 can be easily made greater than an average particle diameter of the fluorescent particles in the fluorescence-containing resin layer 14, and more specifically, can easily be set to half the maximum thickness of the fluorescence-containing resin layer 14 (thickness of the fluorescence-containing resin layer 14 directly below the transparent member 18) or greater.

The bluish white color 43 can be emitted upward along the outer circumference of the transparent member 18, so that it can be mixed with the yellow light 41 generated as a result of the aforementioned color separation, to become substantially white light. Accordingly, in the first exemplary embodiment, white light can be emitted even from the edge portion of the transparent member 18, making it possible to provide a light-emitting device with little or no color unevenness.

If the size of the transparent member 18 is smaller than that of the epitaxial layer 12 (a<A−50 μm and b<B−50 μm) as shown in FIG. 4B, light can exit from the increased area of the edge surface of the fluorescence-containing resin layer 14 on the outer side (outside the transparent member 18 as viewed from above). Further, the thickness of the edge surface of the fluorescence-containing resin layer 14 is smaller than that in the case of FIG. 4A. Accordingly, bluish white light 43 emitted from the edge surface can contain more blue color components than the bluish white light 43 emitted from the edge surface in FIG. 4A.

The yellow light 41 generated as a result of the color separation at the edge surface of the transparent member 18 and the bluish white light 43 are mixed to become white light, and the white light generated at this time may contain more blue color components than that in the case of FIG. 4A. However, color unevenness can still be suppressed compared to Comparative Example 1 shown in FIG. 4C where the yellow light 41 is emitted as it is.

Comparative Example 1 shows the case where the transparent member 18 is larger than the epitaxial layer 12 (a>A and b>B) as shown in FIG. 4C. In this case, the sloping edge surface of the fluorescence-containing resin layer 14 is not included on the outer side (outside of the transparent member 18). Accordingly, light from the fluorescence-containing resin layer 14 will not be emitted directly from a part on the outer side, and yellow light 41 generated as a result of the color separation at the edge surface of the transparent member 18 is emitted "as it is" accordingly. This makes light yellowish emitted from a place near the edge portion of the transparent member 18, generating color unevenness.

As described above, in the first exemplary embodiment, the transparent member 18 having a size substantially the same as or smaller than that of the epitaxial layer 12 can be disposed on the fluorescence-containing resin layer 14, and the sloping edge surface of the fluorescence-containing resin layer 14 can be formed on the outer side (outside the transparent member 18). Thus, the first exemplary embodiment can provide a light-emitting device that remedies color unevenness to be caused by chromaticity difference between the edge portion of the transparent member 18 and other portions.

Manufacturing Method

An exemplary method of manufacturing the light-emitting device of the first exemplary embodiment is described below.

First, the back electrode of the support substrate 13 of the LED element 11 can be disposed on the mounting substrate 10 by using a die-attaching agent.

Then, wire bonding can be performed while the pair of cathode electrodes 15 is bonded first and the electrode pattern 16 of the mounting substrate 10 is bonded next. The loop top of the bonding wires 17 can be placed at a position that is above the upper surface of the LED element 11 by a not-so-great distance in a range of from 100 μm to 200 μm, for example. The cathode electrodes 15 and the electrode pattern 16 may be bonded in reversed order.

Next, a fluorescent material, and if necessary, beads can be mixed into uncured resin and are dispersed to prepare uncured fluorescence-containing resin. The uncured fluorescence-containing resin can be applied in predetermined amount onto the upper surface of the LED element 11 with a dispenser. Instead of a dispenser, a printing process can also or alternatively be used to form the uncured fluorescence-containing resin. The shape of the sloping surface of the completed fluorescence-containing resin layer 14 can be controlled by controlling the amount of the fluorescence-containing resin to be applied.

The transparent member 18 having a predetermined shape prepared in advance can be placed such that the transparent member 18 comes into contact with the upper surface of the uncured fluorescence-containing resin. Then, the weight of the transparent member 18 can make the uncured fluorescence-containing resin cover the front and side surfaces of the epitaxial layer 12. The uncured fluorescence-containing resin can extend as far as to the edge portion of the upper surface of the epitaxial layer 12 and at the same time, and the uncured fluorescence-containing resin can be leveled by the beads or fluorescent particles, thereby determining the thickness of the uncured fluorescence-containing resin directly below the transparent member 18. Further, each side of the transparent member 18 can be caused to move to be parallel to a corresponding side of the support substrate 13 by the surface tension of the uncured fluorescence-containing resin, and can be self-aligned. This can place the transparent member 18 over the center of the support substrate 13 with substantially no displacement. At the same time, the shape of the edge surface of the fluorescence-containing resin layer 14 is determined based on a relationship between the sizes of the transparent member 18 and the support substrate 13, and the amount of the applied fluorescence-containing resin. As a result, the fluorescence-containing resin layer 14 having an edge surface with a steeply tapered shape can be formed.

If a side surface of the epitaxial layer 12 and a side surface of the support substrate 13 are distanced by 100 µm or more, the support substrate 13 may be enclosed by a transparent resin except for parts of the cathode electrodes 15 before the fluorescence-containing resin is applied. This can hold back the flow of the fluorescence-containing resin, making it possible to form the fluorescence-containing resin layer 14 having an edge surface of a steeply tapered shape.

After placement of the transparent member 18, the fluorescence-containing resin layer 14 can be cured in a predetermined curing step while the shape of the fluorescence-containing resin layer 14 can be maintained. As an example of the curing step, the fluorescence-containing resin layer 14 can be heated for about four hours at a temperature of 150° C. As a result, the formation of the light-emitting device of the first exemplary embodiment is completed.

Figure 5A:
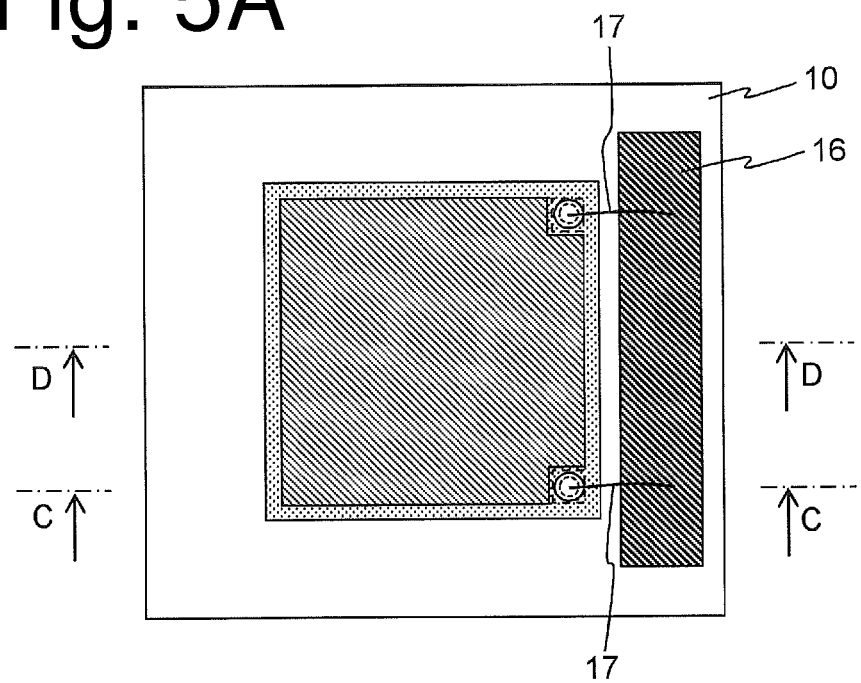
FIG. 5A is a top view.
Figure 5B:
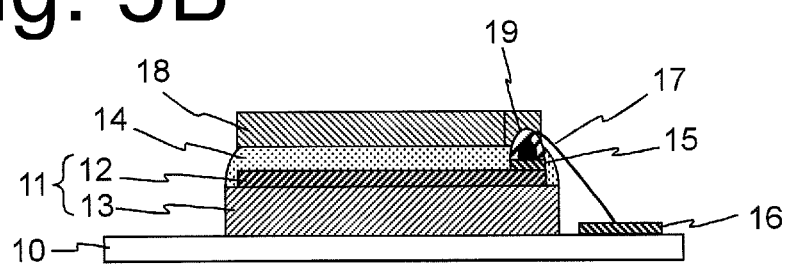
FIGS. 5B and 5C are sectional views taken along lines C-C and D-D of FIG. 5A, respectively, showing a light-emitting device of a second exemplary embodiment.
Figure 5C:
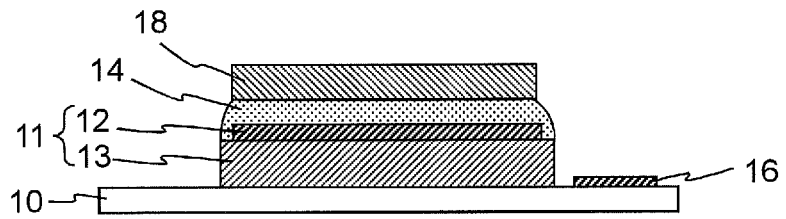

A light-emitting device of a second exemplary embodiment is described with reference to FIGS. 5A to 5C. FIG. 5A is a top view, and FIGS. 5B and 5C are sectional views taken along lines C-C and D-D respectively.

In the second exemplary embodiment, a sealing resin 19 can be provided to seal bonding balls and the wires 17 near the bonding balls. The bonding balls can be formed when the bonding wires 17 are bonded first to the cathode electrodes 15. The structure of the second exemplary embodiment may be the same in other respects as that of the first exemplary embodiment. A transparent resin or a white resin (transparent resin containing light-reflecting particles) can be used as the sealing resin 19.

Provision of the sealing resin 19 can prevent contact of the fluorescence-containing resin layer 14 with the cathode electrodes 15, the balls, and the wires 17 near the balls. Thus, light emitted from the epitaxial layer 12 can be reflected off surroundings of the cathode electrodes 15, the balls, and the wires 17 near the balls, and the reflecting light can be prevented from repeatedly reflecting off fluorescent particles. Accordingly, highly efficient conversion to yellow fluorescent light due to repeated reflection will not occur, making it possible to prevent color unevenness.

Thus, the second exemplary embodiment can prevent color unevenness at an edge portion of the transparent member 18 and further, color unevenness in the surroundings of the cathode electrodes 15.

A method of manufacturing the light-emitting device of the embodiment additionally can include the following step performed after a wire bonding step. In this step, the sealing resin can be applied on the cathode electrodes 15 such that the sealing resin seals the bonding balls, and is then cured. The sealing resin can have high viscosity in order to prevent flow of the sealing resin out of the cathode electrodes 15. Then, the step of forming the fluorescence-containing resin layer 14 can be performed. The other steps of the method of the second exemplary embodiment can be the same as those of the first exemplary embodiment.

A light-emitting device of a third exemplary embodiment is described with reference to FIG. 6A.

Figure 6:
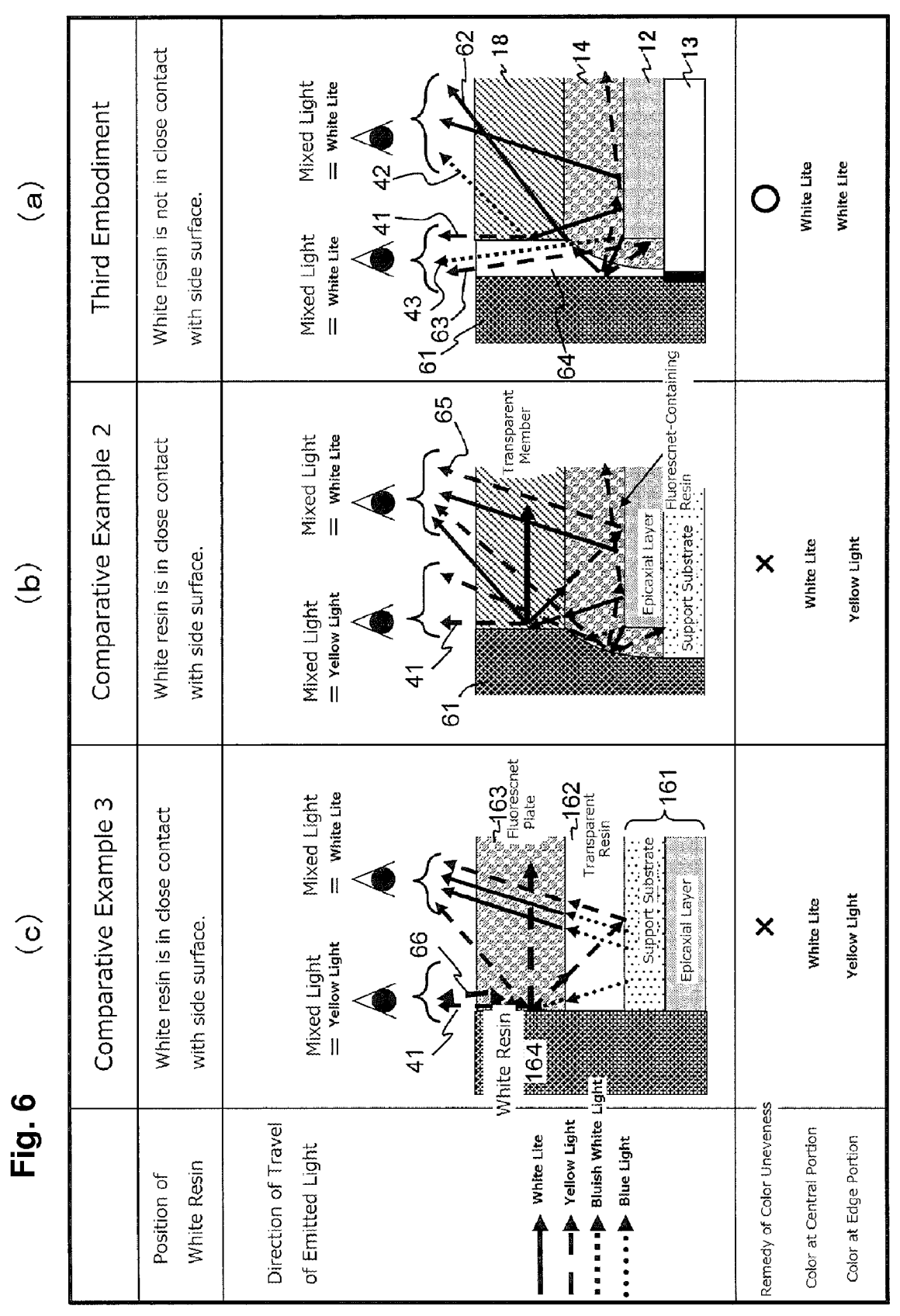

In the third exemplary embodiment, as shown in FIG. 6A, a light-reflecting resin layer 61 can be provided on the outer side (outside the edge surface of the fluorescence-containing resin layer 14 as viewed from above, and outside the edge surface of the transparent member 18) while a gap 64 of a predetermined distance is left between the light-reflecting resin layer 61 and these edge surfaces. A surface of the light-reflecting resin layer 61 that faces the edge surfaces of the fluorescence-containing resin layer 14 and the transparent member 18 can be a wall surface (upright wall surface) parallel to the normal to the support substrate 13. A side surface of the support substrate 13 can contact the light-reflecting resin layer 61. The gap 64 may be filled with a transparent resin, or may be empty.

In the third exemplary embodiment, the gap 64 can be formed between the edge surfaces of the fluorescence-containing resin layer 14 and the transparent member 18, and the upright wall surface of the light-reflecting resin layer 61. Accordingly, like in the first exemplary embodiment, bluish white light exiting upward from the edge surface of the fluorescence-containing resin layer 14 and passing through the gap 64 can be emitted from the top of the light-emitting device without interference with the upright wall surface. As a result, bluish white light 42 can be mixed with yellow light 41 generated as a result of color separation at the edge surface of the transparent member 18 to become white light, making it possible to prevent color unevenness at the edge portion of the transparent member 18.

As a result of provision of the light-reflecting resin layer 61, light 62 being part of white light generated inside the fluorescence-containing resin layer 14 by mixture of fluorescent light and blue light and emitted laterally from the edge surface of the fluorescence-containing resin layer 14 can be reflected off the light-reflecting resin layer 61, and then can enter the fluorescence-containing resin layer 14 and the transparent member 18 again. Part of the light 62 can be emitted from the upper surface of the transparent member 18. This means that light reflecting off the side surface can be emitted from the upper surface of the transparent member 18, allowing increase of the brightness level of the upper surface of the transparent member 18.

Meanwhile, part of the light having entered the fluorescence-containing resin layer 14 again after reflecting off the light-reflecting resin layer 61 can be reflected off a fluorescent material repeatedly to generate yellow light 63, and the yellow light 63 can be emitted upward from the edge surface of the fluorescence-containing resin layer 14. The yellow light 63 does not generate color unevenness for the following reasons. As a first reason, the thickness of the fluorescence-containing resin layer 14 can be smaller at a place near the edge surface of the fluorescence-containing resin layer 14 than at a place directly below the transparent member 18, so that the fluorescence-containing resin layer 14 contains a fluorescent material in small amount at the place near the edge surface thereof. This makes the light amount of the yellow light 63 small generated by repeated reflection. As a second reason, as a result of formation of the gap 64 between the edge surfaces of the fluorescence-containing resin layer 14 and the transparent member 18, and the upright wall surface of the light-reflecting resin layer 61, the bluish white light 43 described in the first exemplary embodiment that is emitted upward from the edge surface of the fluorescence-containing resin layer 14 can pass through the gap 64, and can be emitted from the top of the light-emitting device without interference with the upright wall surface. As a result, the bluish white light 43 can be mixed with the yellow light 63 generated as a result of repeated reflection and the yellow light 41 generated as a result of separation at the edge surface of the transparent member 18 to become white light. This can prevent color unevenness at the edge portion of the transparent member 18.

An exemplary method of manufacturing the light-emitting device of the third exemplary embodiment is described below. First, like the manufacturing method of the first exemplary embodiment, the back surface of the support substrate 13 of the LED element 11 can be bonded by die bonding to the mounting substrate 10. Next, a ring made of the light-reflecting resin layer 61 can be disposed on the outer side than the support substrate 13 such that the gap 64 is formed between the ring and the epitaxial layer 12, and then the ring can be fixed with an adhesive agent onto the mounting substrate 10. The ring may be molded in advance by using the light-reflecting resin layer 61, or may be formed by applying the light-reflecting resin layer 61 on the mounting substrate 10 with a dispenser or the like. Next, like in the first exemplary embodiment, a wire bonding step, a step of forming the uncured fluorescence-containing resin layer 14, a step of placing the transparent member 18, and a step of curing the fluorescence-containing resin layer 14 can be performed. A transparent resin can thereafter be applied in the gap 64 between the ring made of the light-reflecting resin layer 61, and the edge surfaces of the fluorescence-containing resin layer 14 and the transparent member 18 with a dispenser or the like such that the transparent resin is brought into close contact with the edge surfaces of the fluorescence-containing resin layer 14 and the transparent member 18.

If the gap 64 is left empty, the light-reflecting resin layer 61 formed in advance by using a light-reflecting resin can be placed to face the edge surfaces of the fluorescence-containing resin layer 14 and the transparent member 18, and then the light-reflecting resin layer 61 can be fixed with an adhesive agent or the like to the mounting substrate 10.

Comparative Example 2 shows the case where the light-reflecting resin layer 61 is in close contact with the edge surfaces of the fluorescence-containing resin layer 14 and the transparent member 18 as shown in FIG. 6B.

In the structure of Comparative Example 2, white light emitted laterally from the edge surfaces of the fluorescence-containing resin layer 14 and the transparent member 18 can be reflected off the light-reflecting resin layer 61 to become return light, thereby increasing the brightness level of the upper surface of the transparent member 18. At this time, the wavelength dependency of a refraction index may cause separation of the white light into yellow light and blue light. Accordingly, yellow light 41 can be generated at the edge portion of the transparent member 18. Further, the return light being reflected off the fluorescence-containing resin layer 14 becomes yellow fluorescent light. Accordingly, yellow light 65 can also reach the upper surface of the transparent member 18. As a result, the presence of the yellow light 41 and the yellow light 65 can increase the entire amount of yellow light in the transparent member 18. A central portion of the transparent member 18 can have a high brightness level, and white light emitted in Comparative Example 2 can contain more yellow color components than that of the third exemplary embodiment having the same structure as that of Comparative Example 2 except for the presence of the gap 64.

The light-reflecting resin layer 61 can cover the edge surface of the fluorescence-containing resin layer 14. Accordingly, unlike in the third exemplary embodiment, the bluish white color 43 is not emitted upward from the edge surface of the fluorescence-containing resin layer 14. As a result, the yellow light 41 generated as a result of separation during reflection may not become white light.

Accordingly, in the structure of Comparative Example 2, white light emitted from the entire upper surface of the transparent member 18 may contain many yellow color components, and may be yellowish at the edge portion of the transparent member 18 due to the presence of the yellow light 41. Thus, the structure of Comparative Example 2 may not effectively remedy color unevenness.

Comparative Example 3 shows the case where, like in patent literature 1, a fluorescent plate 163 is adhesively disposed over the upper surface of a flip-chip light-emitting element 161 with a transparent resin 162, and an edge surface of the fluorescent plate 163 is covered with a light-reflecting resin 164 as shown in FIG. 6C.

In the structure of Comparative Example 3, blue light from the light-emitting element 161 can impinge on the fluorescent plate 163. Part of the blue light can be converted to yellow fluorescent light to generate white light, and the white light can be emitted from the upper surface of the fluorescent plate 163. The light-reflecting resin 164 allows the white light to be reflected off an edge surface of the fluorescent plate 163. At this time, the wavelength dependency of a refraction index makes reflection angles of blue light and yellow light different from each other. Accordingly, yellow light 41 can be emitted from an edge portion of the fluorescent plate 163. The blue light caused to be reflected off the edge surface of the fluorescent plate 163 by the light-reflecting resin 164 can be repeatedly reflected off a fluorescent material to be converted to yellow light 66. As a result, yellowish light formed of the yellow light 41 and the yellow light 66 can be emitted from the edge portion of the fluorescent plate 163 and at the same time, white light can be emitted from a central portion of the fluorescent plate 163. This may generate color unevenness at the central and edge portions of the fluorescent plate 163

A light-emitting device of a fourth exemplary embodiment is described with reference to FIGS. 7A and 7B. FIG. 7A is a top view, and FIG. 7B is a sectional view taken along line E-E. To facilitate understanding of the drawings, hatchings are added to FIG. 7A.

The light-emitting device of the fourth exemplary embodiment can use a flip-chip LED element 111 in place of the LED element 11 of the light-emitting device of the first exemplary embodiment. The LED element 111 can include a growth substrate 113, and an epitaxial layer 12 with a light emitting layer grown on the lower surface of the growth substrate 113. The growth substrate 113 can be transparent to light emitted from the epitaxial layer 12.

An anode electrode and a cathode electrode (not shown) can be provided on the lower surface of the epitaxial layer 12. The LED element 111 can be disposed on the mounting substrate 10 with bumps 117 while the growth substrate 113 can point upward and the epitaxial layer 12 can point toward the mounting substrate 10. The upper surface of the mounting substrate 10 is given a stepped part 10a provided to define a region in which the fluorescence-containing resin layer 14 is formed. A pair of electrode patterns 116 can be disposed on the stepped part 10a. The anode and cathode electrodes of the LED element 111 can be connected through the bumps 117 to the electrode patterns 116 as a pair.

The fluorescence-containing resin layer 14 can be present between the growth substrate 113 and the transparent member 18. The fluorescence-containing resin layer 14 can also cover side surfaces of the growth substrate 113 and the epitaxial layer 12, and can fill a gap between the epitaxial layer 12 and the mounting substrate 10. A region on the mounting substrate 10 in which the fluorescence-containing resin layer 14 is formed corresponds to the region of the stepped part 10a.

In the light-emitting device of the fourth exemplary embodiment, two sides of the rectangle of the transparent member 18 can also have lengths a and b that are substantially the same as or shorter than the lengths A and B of corresponding two sides of the epitaxial layer 12 (a≦B, b≦B). If the lengths a and b of the two sides of the transparent member 18 are shorter than the lengths A and B of the two sides of the epitaxial layer 12, the differences between the corresponding sides may not exceed 50 µm. To be specific, it is desirable that the following relationships be satisfied: (A−50 µm)≦a—A and (B−50 µm)≦b≦B.

A part of the edge surface of the fluorescence-containing resin layer 14 above the upper surface of the epitaxial layer 12 can have a steeply tapered shape that forms an angle θ of 60 degrees or smaller relative to the normal to the support substrate 13. The structure of the fourth exemplary embodiment can be the same in other respects as that of the first exemplary embodiment, so like portions will not be described again.

Light emitted from the epitaxial layer 12 can travel upward while passing through the growth substrate 113. Part of the light can be subjected to wavelength conversion at the fluorescence-containing resin layer 14 to become yellow light, and can then be emitted from the transparent member 18. Color separation occurs when white light is reflected off a side surface of the transparent member 18 to emit resultant yellow light from a place near an edge portion of the transparent member 18. Here, like in the first exemplary embodiment, bluish white light can be emitted from a sloping edge surface of the fluorescence-containing resin layer 14 on the outer side (outside the transparent member 18). This bluish white light can be mixed with the yellow light to become white light, thereby preventing color unevenness.

The light-emitting device described in each of the first to fourth exemplary embodiments includes only one LED element disposed on a mounting substrate. Meanwhile, a plurality of the LED elements 11 of the first exemplary embodiment may be placed in line on the mounting substrate 10, and the transparent member 18 of a large size may be formed in the entire light-emitting device as shown in FIGS. 8A to 8C and FIGS. 9A to 9C. FIG. 8A is a top view, and FIGS. 8B and 8C are sectional views taken along lines F-F and G-G respectively. FIG. 9A is a top view, and FIGS. 9B and 9C are sectional views taken along lines H-H and I-I respectively.

In the shape shown in FIGS. 8A to 8C, fluorescence-containing resin layers 14 can be formed independently of each other on the LED elements 11. In the shape shown in FIGS. 9A to 9C, fluorescence-containing resin layers 14 can be coupled to each other on the LED elements 11. In either case, bluish white light can be emitted from an edge surface of the fluorescence-containing resin layer 14 on the outer side (outside the large-sized transparent member 18). Accordingly, yellow light generated as a result of color separation at the edge surface of the transparent member 18 can become white light, making it possible to suppress color unevenness.

The LED element 11 of the first exemplary embodiment is placed in the structures of FIGS. 8A-9C. Meanwhile, a light-emitting device can certainly be formed in the same manner by placing a plurality of the LED elements of other exemplary embodiments.

EXAMPLE

The light-emitting device of the first exemplary embodiment was manufactured to create the present Example. Further, a light-emitting device having the structure of Comparative Example 1 shown in FIG. 4C was manufactured to create the present Comparative Example. The chromaticities of these light-emitting devices were measured to evaluate the color unevenness thereof.

The light-emitting device of the Comparative Example includes an LED element and a mounting substrate which are the same as the LED element 11 and the mounting substrate 10 of the Example. Further, the light-emitting device of the Comparative Example includes a transparent member and a support substrate of substantially the same size.

Figure 10A:
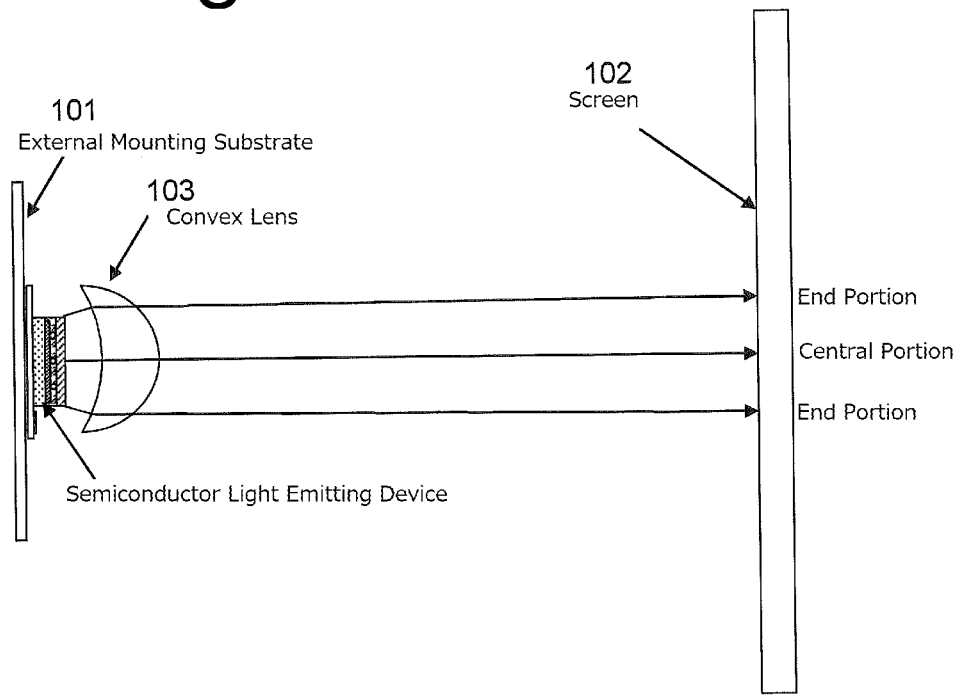
FIGS. 10A and 10B explain how a light-emitting device used in Example is evaluated.
Figure 10B:
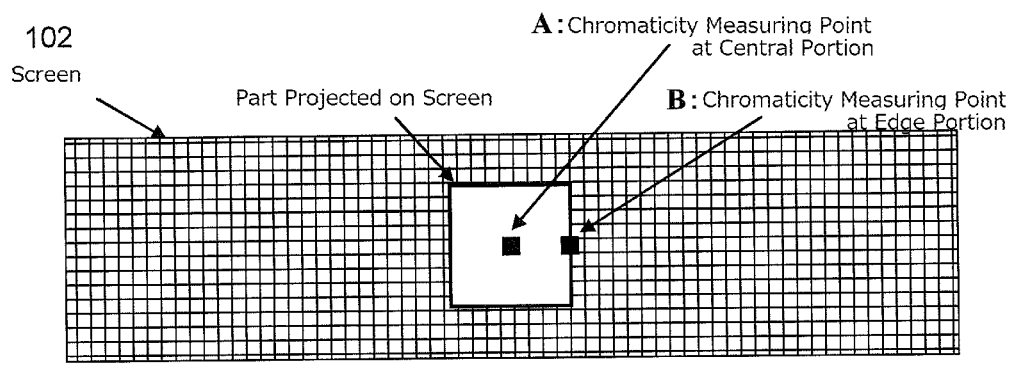

A screen projection technique shown in FIGS. 10A and 10B was employed to measure chromaticities. First, a system shown in FIG. 10A was formed by placing each the light-emitting device of the Example and that of the Comparative Example on an external mounting substrate 101, and placing a convex lens 103 over the light-emitting device. The light-emitting device was turned on, and light emitted therefrom was projected onto a screen 102 forward of the light-emitting device by about 10 meters. At this time, a square pattern formed as a result of light collection by the convex lens 103 was projected on the screen 102 as shown in FIG. 10B. The shape of the square pattern substantially corresponds to the shape of the epitaxial layer 12. Light from a central portion of the epitaxial layer 12 was projected onto a central portion of the square pattern, and light from an edge portion of the epitaxial layer 12 was projected onto an edge portion of the square screen.

In order to measure chromaticity at the central and edge portions of the square pattern projected on the screen 102, chromaticity measuring points A and B were determined at the central and edge portions respectively as shown in FIG. 10B, and chromaticity was measured at these points. Results thereby obtained are shown in Table 1.

TABLE 1

| Evaluation Result Of Chromaticity | | |
|---|---|---|
| | Working Example | Comparative Example 1 |
| Chromaticity at Central Portion (x, y) | White Light (0.332, 0.344) | White Light (0.332, 0.346) |
| Chromaticity at Edge Portion (x, y) | White Light (0.338, 0.349) | Yellow Light (0.375, 0.422) |

As clearly seen from Table 1, the light-emitting device of Comparative Example 1 produced different chromaticities at the central and edge portions, and a projection pattern observed therein has color unevenness with the yellowish edge portion. In contrast, the Example produced substantially no difference in chromaticity between the central and edge portions, and a projection pattern obtained therein has uniform color shade.

Thus, it was confirmed that the light-emitting device of the first embodiment is capable of emitting light that does not generate color unevenness.

It will be apparent to those skilled in the art that various modifications and variations can be made in the presently disclosed subject matter without departing from the spirit or scope of the presently disclosed subject matter. Thus, it is intended that the presently disclosed subject matter cover the modifications and variations of the presently disclosed subject matter provided they come within the scope of the appended claims and their equivalents. All related art references described above are hereby incorporated in their entirety by reference.

What is claimed is:

1. A light-emitting device, comprising:
a mounting substrate;
a light-emitting element disposed on the mounting substrate;
a fluorescence-containing resin layer disposed on the light-emitting element and containing fluorescent particles; and
a light-transmitting member disposed on the fluorescence-containing resin layer,
wherein the light-emitting element includes a light emitting structure layer and a support substrate supporting the light-emitting structure layer, the light emitting structure layer being at least one semiconductor layer including at least a light-emitting layer,
a size of the light-transmitting member being substantially the same as or smaller than a size of the light-emitting structure layer, the fluorescence-containing resin layer having a sloping edge surface connecting an edge portion of the light-transmitting member and an edge portion of the support substrate.

2. A light-emitting device, comprising:
a mounting substrate;
a light-emitting element disposed on the mounting substrate;
a fluorescence-containing resin layer disposed on the light-emitting element and containing fluorescent particles; and
a light-transmitting member disposed on the fluorescence-containing resin layer,
wherein the light-emitting element includes a light emitting structure layer and a support substrate supporting the light emitting structure layer, the light emitting structure layer being at least one semiconductor layer including at least a light emitting layer,
a size of the light-transmitting member being substantially the same as or smaller than a size of the light emitting structure layer, the fluorescence-containing resin layer having an edge surface disposed on the outer side than a side surface of the light-transmitting member.

3. The light-emitting device according to claim 1, wherein a thickness of the fluorescence-containing resin layer directly above an edge portion of the light emitting structure layer is greater than a particle diameter of the fluorescent particles contained in the fluorescence-containing resin layer.

4. The light-emitting device according to claim 2, wherein a thickness of the fluorescence-containing resin layer directly above an edge portion of the light emitting structure layer is greater than a particle diameter of the fluorescent particles contained in the fluorescence-containing resin layer.

5. The light-emitting device according to claim 1, wherein the edge surface of the fluorescence-containing resin layer forms an angle of 60 degrees or smaller relative to the normal to the support substrate.

6. The light-emitting device according to claim 2, wherein the edge surface of the fluorescence-containing resin layer forms an angle of 60 degrees or smaller relative to the normal to the support substrate.

7. The light-emitting device according to claim 3, wherein the edge surface of the fluorescence-containing resin layer forms an angle of 60 degrees or smaller relative to the normal to the support substrate.

8. The light-emitting device according to claim 4, wherein the edge surface of the fluorescence-containing resin layer forms an angle of 60 degrees or smaller relative to the normal to the support substrate.

9. The light-emitting device according to claim 1, wherein a difference between a length of one side of the light-transmitting member and a length of a corresponding side of the light emitting structure layer is 50 μm or smaller, and the light-transmitting member is a plate-like member.

10. The light-emitting device according to claim 2, wherein a difference between a length of one side of the light-transmitting member and a length of a corresponding side of the light emitting structure layer is 50 μm or smaller, and the light-transmitting member is a plate-like member.

11. The light-emitting device according to claim 3, wherein a difference between a length of one side of the light-transmitting member and a length of a corresponding side of the light emitting structure layer is 50 μm or smaller.

12. The light-emitting device according to claim 4, wherein a difference between a length of one side of the light-transmitting member and a length of a corresponding side of the light emitting structure layer is 50 μm or smaller.

13. The light-emitting device according to claim 5, wherein a difference between a length of one side of the light-transmitting member and a length of a corresponding side of the light emitting structure layer is 50 μm or smaller.

14. The light-emitting device according to claim 6, wherein a difference between a length of one side of the light-transmitting member and a length of a corresponding side of the light emitting structure layer is 50 μm or smaller.

15. The light-emitting device according to claim 1, wherein
an electrode is located on an upper surface of the light emitting structure layer, the electrode being connected through a bonding wire to a mounting electrode pattern on the mounting substrate, and
a sealing resin is located on the electrode, the sealing resin sealing a connection between the electrode and the bonding wire.

16. The light-emitting device according to claim 2, wherein
an electrode is located on an upper surface of the light emitting structure layer, the electrode being connected through a bonding wire to a mounting electrode pattern on the mounting substrate, and
a sealing resin is located on the electrode, the sealing resin sealing a connection between the electrode and the bonding wire.

17. The light-emitting device according to claim 3, wherein
an electrode is located on an upper surface of the light emitting structure layer, the electrode being connected through a bonding wire to a mounting electrode pattern on the mounting substrate, and
a sealing resin is located on the electrode, the sealing resin sealing a connection between the electrode and the bonding wire.

18. The light-emitting device according to claim 4, wherein
an electrode is located on an upper surface of the light emitting structure layer, the electrode being connected through a bonding wire to a mounting electrode pattern on the mounting substrate, and
a sealing resin is located on the electrode, the sealing resin sealing a connection between the electrode and the bonding wire.

19. The light-emitting device according to claim 5, wherein
an electrode is located on an upper surface of the light emitting structure layer, the electrode being connected through a bonding wire to a mounting electrode pattern on the mounting substrate, and
a sealing resin is located on the electrode, the sealing resin sealing a connection between the electrode and the bonding wire.

20. The light-emitting device according to claim 6, wherein an electrode is located on an upper surface of the light emitting structure layer, the electrode being connected through a bonding wire to a mounting electrode pattern on the mounting substrate, and a sealing resin is located on the electrode, the sealing resin sealing a connection between the electrode and the bonding wire.

21. The light-emitting device according to claim 1, wherein a light-reflecting resin layer is configured to face the edge surface of the fluorescence-containing resin layer and an edge surface of the light-transmitting member while a predetermined gap is left between the light-reflecting resin layer and the edge surfaces.

22. The light-emitting device according to claim 2, wherein a light-reflecting resin layer is configured to face the edge surface of the fluorescence-containing resin layer and an edge surface of the light-transmitting member while a predetermined gap is left between the light-reflecting resin layer and the edge surfaces.

23. The light-emitting device according to claim 21, wherein the gap is filled with a transparent material transparent to light emitted from the light-emitting element.

24. The light-emitting device according to claim 22, wherein the gap is filled with a transparent material transparent to light emitted from the light-emitting element.

25. A light-emitting device, comprising:
a mounting substrate;
a plurality of light-emitting elements disposed on the mounting substrate;
a fluorescence-containing resin layer disposed on the light-emitting elements and including fluorescent particles; and
one light-transmitting plate-like member disposed on the fluorescence-containing resin layer such that the plate-like member covers all the light-emitting elements,
wherein the light-emitting elements each include a light emitting structure layer and a support substrate supporting the light emitting structure layer, the light emitting structure layer being at least one semiconductor layer including at least a light emitting layer,
the plate-like member having an edge surface located at a position directly above an edge surface of the light emitting structure layer or at a position closer to a center of the light emitting structure layer than the edge surface of the light emitting structure layer, the fluorescence-containing resin layer having a sloping edge surface connecting an edge portion of the plate-like member and an edge portion of the support substrate.

26. A light-emitting device, comprising:
a mounting substrate;
a light-emitting element disposed on the mounting substrate;
a fluorescence-containing resin layer disposed on the light-emitting element and including fluorescent particles; and
a light-transmitting plate-like member disposed on the fluorescence-containing resin layer,
wherein the light-emitting element includes a light emitting structure layer and a support substrate supporting the light emitting structure layer, the light emitting structure layer being at least one semiconductor layer including at least a light emitting layer,
the plate-like member having an edge surface located at a position directly above an edge surface of the light emitting structure layer or at a position closer to a center of the light emitting structure layer than the edge surface of the light emitting structure layer, the fluorescence-containing resin layer having an edge surface disposed on an outer side as compared to a side surface of the plate-like member as viewed from above.

* * * * *